US006629367B2

United States Patent
Burdon et al.

(10) Patent No.: US 6,629,367 B2
(45) Date of Patent: Oct. 7, 2003

(54) ELECTRICALLY ISOLATED VIA IN A MULTILAYER CERAMIC PACKAGE

(75) Inventors: Jeremy W. Burdon, Scottsdale, AZ (US); Ross A. Miesem, Albuquerque, NM (US); Chowdary Ramesh Koripella, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 16 days.

(21) Appl. No.: 09/730,959

(22) Filed: Dec. 6, 2000

(65) Prior Publication Data

US 2002/0066593 A1 Jun. 6, 2002

(51) Int. Cl.[7] .............................. H05K 3/42; B05D 5/12
(52) U.S. Cl. .............................. 29/852; 29/846; 29/611; 427/97; 427/264; 427/510; 174/262; 174/264; 361/780
(58) Field of Search .......................... 29/852, 846, 851, 29/830, 831, 840, 611; 427/97, 264, 508, 510, 515; 174/262, 264, 263, 265; 361/780

(56) References Cited

U.S. PATENT DOCUMENTS

| 3,691,632 A | * | 9/1972 | Smith ........................ 427/97 |
| 4,156,038 A | * | 5/1979 | Fock et al. ................. 427/264 |
| 4,571,322 A | | 2/1986 | Eichelberger et al. |
| 4,715,117 A | | 12/1987 | Enomoto |
| 4,794,048 A | | 12/1988 | Oboodi et al. |
| 4,997,698 A | | 3/1991 | Oboodi et al. |
| 5,013,948 A | | 5/1991 | Tumpey et al. |
| 5,034,091 A | | 7/1991 | Trask et al. |
| 5,065,227 A | | 11/1991 | Frankeny et al. |
| 5,135,595 A | | 8/1992 | Acocella et al. |
| 5,257,452 A | * | 11/1993 | Imai et al. ................. 29/852 |
| 5,308,443 A | * | 5/1994 | Sugihara .................. 29/852 X |
| 5,316,787 A | | 5/1994 | Frankeny et al. |
| 5,468,652 A | | 11/1995 | Gee |
| 5,565,262 A | | 10/1996 | Azzaro et al. |
| 5,723,353 A | | 3/1998 | Muenzel et al. |
| 5,760,530 A | | 6/1998 | Kolesar |
| 5,977,850 A | | 11/1999 | Chaturvedi |
| 6,000,120 A | | 12/1999 | Arledge et al. |

FOREIGN PATENT DOCUMENTS

| EP | 0163368 | | 12/1985 | |
| JP | 4-336493 | * | 11/1992 | ............ 29/852 |
| JP | 5-90762 | * | 4/1993 | ............ 29/851 |
| JP | 5-206641 | * | 8/1993 | ............ 29/852 |
| JP | 6-45734 | * | 2/1994 | ............ 29/846 |
| JP | 6-302968 | * | 10/1994 | ............ 29/852 |
| WO | WO 99/46813 | | 9/1999 | |

OTHER PUBLICATIONS

Morshima et al, High Performance Photo–Sensitive Insulating Materials for High Density Multi–Layer Boards, IEMT/IMC Symposium, 2nd 1998, pp. 68–71, Apr. 1998.*
Website: "Green Tape™," DuPont Microcircuit Materials, www.dupont.com/mcm/product/tape.html, pp. 1–3, Aug. 28, 2000.
Website: "High Temperature Zirconium Oxide Oxygen Sensors Explained," Cambridge Sens Tec L, www.kings.vispa.co.uk/sensors_explained.htm, pp. 1–5, Oct. 31, 2000.

* cited by examiner

Primary Examiner—A. Dexter Tugbang
(74) Attorney, Agent, or Firm—William E. Koch

(57) ABSTRACT

A method for forming an electrically isolated via in a multilayer ceramic package and an electrical connection formed within the via are disclosed. The method includes punching a first via in a first layer, filling the first via with a cross-linkable paste, curing the paste to form an electrical insulator precursor and forming the via in the insulator precursor. The electrical connection formed includes an insulator made from a cross-linked paste supported by a substrate of a multilayer ceramic package and a conductive connection supported by the insulator.

6 Claims, 3 Drawing Sheets

US 6,629,367 B2

ELECTRICALLY ISOLATED VIA IN A MULTILAYER CERAMIC PACKAGE

FIELD OF THE INVENTION

The present invention relates to multilayer ceramic devices, and more particularly to a method for forming a multilayer ceramic package having an electrically isolated via and an isolated electrical connection.

BACKGROUND OF THE INVENTION

Certain multilayer ceramic packages are formed by layering a ceramic layer such as green tape (e.g., alumina tape, zirconia tape or the like) with one or more additional layers, such as conducting layers provided in a paste or other form. Thereafter, the conductive layers and the green tape layers are densified, such as by sintering. Some of these ceramic layers could be conductive (ionic or electronic) at high temperatures (e.g., zirconia) and a multilayer ceramic package designer may desire to form one or more electrically isolated vias in one or more of the conductive layers of a multilayer ceramic package. There is therefore a need for a method of efficiently and effectively forming electrically isolated vias in multilayer ceramic packages and for electrical connections formed with such vias.

DETAILED DESCRIPTION OF THE DRAWINGS

In accordance with one aspect of the present invention, a method is employed for forming an electrically isolated via in a layer of a ceramic device. In general, the method includes the steps of providing a ceramic green tape and forming a first via in the green tape. A hardenable non-conductive paste is placed in the first via and is hardened. A second via is formed in the hardened non-conductive paste and within the first via. Thereafter, a conductive paste is placed in the second via for forming an electrical connection.

Figure 1:
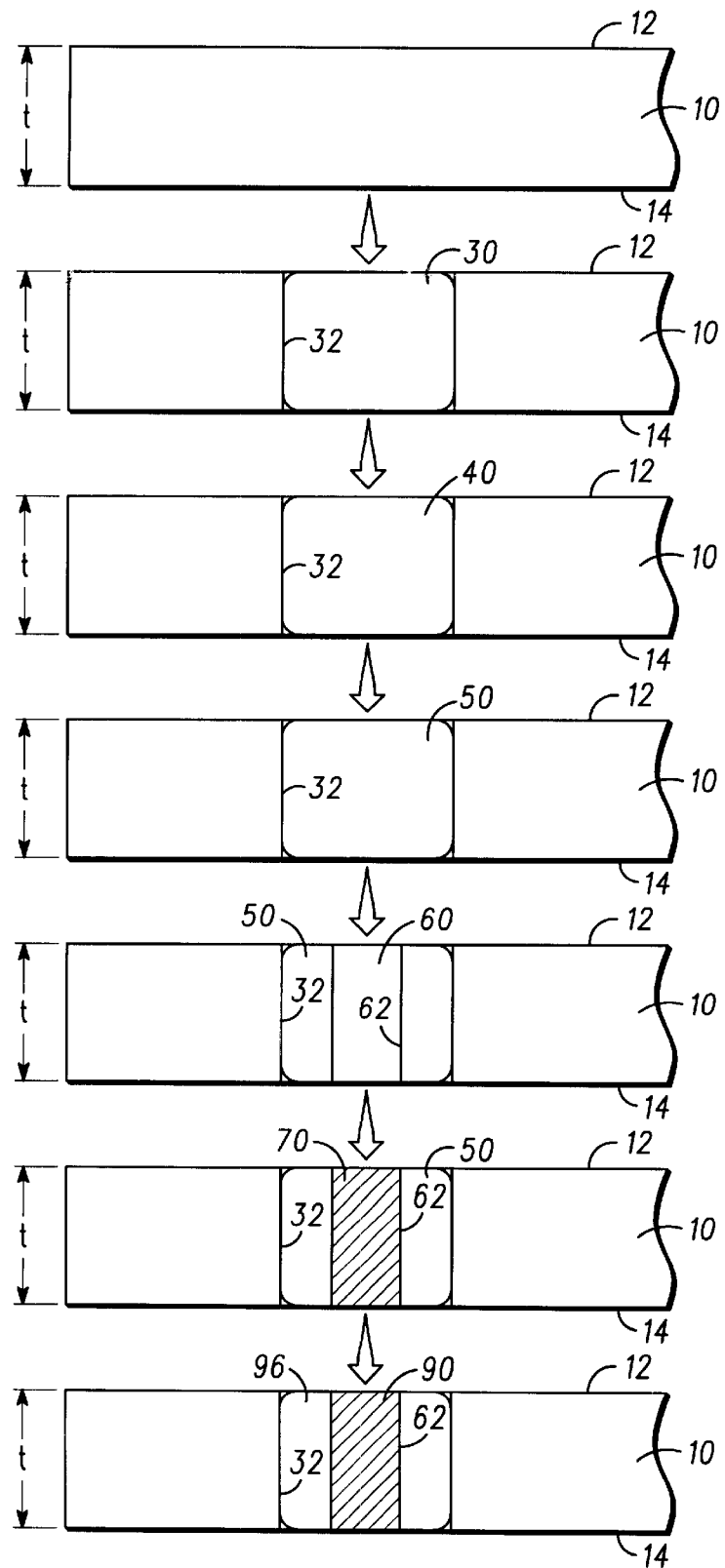
FIG. 1 illustrates a sequence for processing a layer for a multilayer ceramic package so that the layer includes a via and an electrical connection according to one aspect of the present invention.

More specifically, according to one step of the method, and referring to FIG. 1, a first ceramic layer 10 is provided. The first ceramic layer 10 has a first surface 12 and an opposing second surface 14 separated by a thickness "t". The first layer 10 is preferably an unsintered ceramic material, e.g., a ceramic material in its green state. By way of example, the ceramic material is provided as a green tape which optionally is layered adjacent a metal pad or a ground-plane structure. In one preferred embodiment, the first layer 10 is formed from a suitable ceramic material such as a metallic oxide, nitride, boride or the like. Specific preferred examples include, but are not limited to, zirconia, yttria stabilized zirconia or the like.

A first via 30 is formed in the first layer 10 wherein the first via 30 is at least partially defined by a wall surface 32 of the first layer 10. The first via 30 may be formed using any suitable method of material removal, including punching, drilling, ablating, laser cutting, chemical removal techniques or another suitable technique.

In a preferred embodiment, the first via 30 is formed by registering the first layer 10 in a conventional via-punching machine and punching the first via 30 in the layer 10. Accordingly, the first via 30 is a generally cylindrical passageway bounded by a wall surface 32 which is generally annular in shape. However, the skilled artisan shall appreciate that the first via 30 may be formed in many alternative geometric configurations.

Once the first via 30 is formed, the first via 30 is filled with a hardenable fill paste 40. The fill paste 40 preferably is of sufficient composition and viscosity that it is capable of delivering a non-conductive material to the first via 30, which, upon firing (e.g., at the firing temperature of the first layer 10), will bond to the wall 32 of the layer 10. Moreover, the paste 40 is preferably capable of hardening prior to firing to maintain the non-conductive material fixed to the wall 32 during subsequent pre-firing processing steps. Thus, the fill paste 40 preferably includes a dispersion of particles of non-conductive material in a binder matrix that is capable of hardening.

Any suitable mode of hardening the binded matrix may be employed and will be specific to the desired composition. For example, the material for the fill paste 40 may be a multicomponent curable material, a radiation curable material, an air curable material, a thermally curable material, a moisture curable material or the like. One such fill paste 40 includes an inorganic phase such as alumina, glass or other non-conductive phase and a curable or cross-linkable binder that can form a binder matrix. In one preferred embodiment, the inorganic phase is different from the ceramic material of the first layer 10. Thus, the inorganic phase may be an oxide, such as alumina, and the binder may include a cross-linkable polymer, such as a UV cross-linkable binder or a thermally activated cross-linkable binder. Additionally, the fill paste 40 may include other components such as a dispersant, a solvent or both.

A particularly preferred example of a fill paste 40 includes approximately equal parts (e.g., about 9% by weight) of a UV curable binder such as DuPont 5018 (which is commercially available from E. I. duPont deNemours and Company, Wilmington, Del.); and a solvent such as Alpha Terpineol (which is commercially available from Fisher Scientific, Pittsburgh, Pa.); approximately 1.3% by weight dispersant such as CC-42 NS (which is commercially available from Goldschmidt Chemical, Dublin, Ohio); and approximately 80.7% by weight alumina powder (e.g., A16-SG, which is commercially available from Alcoa, Pittsburgh, Pa.).

It is also possible to employ a plurality of different fill pastes 40, one or more of which may include a conductive material in a hardenable binder matrix.

The fill paste 40 may be inserted within the first via 30 in a variety of manners. In one preferred embodiment, the paste 40 is screen printed or otherwise stenciled into the first via 30.

After the first via 30 is filled with the hardenable fill paste 40, the paste 40 is hardened within the first via 30, thereby forming a solid or at least semi-solid electrical insulator precursor 50. For example, with reference to the above specific teachings, hardening may be accomplished by exposing the fill paste 40 to UV light if the paste 40 includes a UV cross-linkable binder, or by exposing the fill paste 40 to elevated temperatures (e.g., about 70° C. to 90° C.) if the paste includes a thermally initiated cross-linkable binder.

Once the insulator precursor 50 is formed, in a like manner as the first via 30, a second via 60 is formed within the insulator precursor 50 such that the precursor 50 includes a second wall surface 62 for at least partially defining the second via 60. In a preferred embodiment, the substrate 10 is reregistered in the via-punching machine that punched the first via 30 into the substrate 10 and the machine punches the isolated second via 60 with a smaller punch (e.g., a punch of smaller diameter) than the punch used for forming the first via 30. In a preferred embodiment, the second via 60 is generally cylindrical and the wall surface 62 defining the via 60 is generally annular and is spaced approximately 2–5 mils within the surface 32 defining the through hole 30. Again, however, the skilled artisan shall appreciate that the second via 60 may be formed in many alternative geometric configurations.

After the second via 60 is formed, the second via 60 is filled with a suitable conductive paste 70 including a dispersion in a paste matrix of particulated conductive material such as that based upon gold, silver, palladium, platinum, combinations of these materials or the like. Different conductive pastes may be chosen depending upon desired characteristics of the paste, and their firing compatability with the selected ceramic green tape.

Once the second via 60 is filled with the conductive paste 70, the first layer 10, the insulator precursor 50, and the conductive paste 70 are each densified (optionally with other ceramic layers in a package), such as by sintering or co-firing, thereby forming a conductive connection 90 within an insulator 96.

As can be seen, the resulting layer 10 includes a conductive electrical connection 90 supported within and adjoining the insulator 96, which is supported within and adjoins the layer 10. Each of the layer 10, the electrical connection 90 and the insulator 96 have a common thickness "t" defined by coplanar side surfaces.

Figure 2:
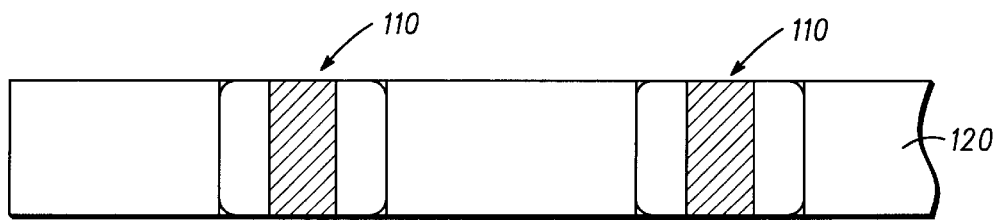
FIG. 2 illustrates a cross-sectional view of a layer having multiple electrical connections formed according to an aspect of the present invention.

Referring to FIG. 2, multiple connections 110 may be formed in a single layer 120 by carrying out the previously delineated steps involved in the method of the invention multiple times at multiple locations either in sequence or concurrently.

Figure 3:
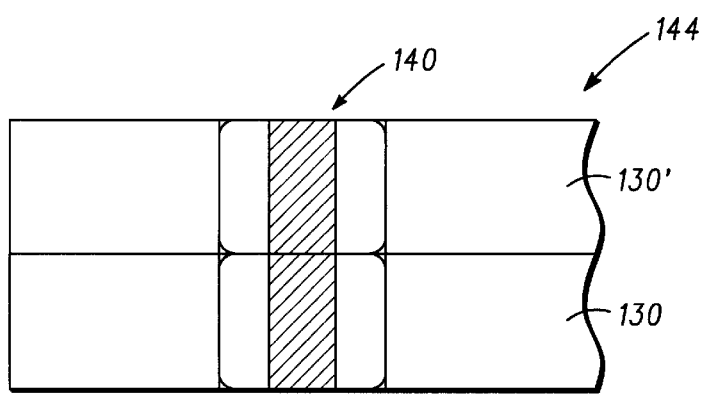
FIG. 3 illustrates a cross-sectional view of multiple layers, each having an electrical connection formed according to an aspect of the present invention.

Referring to FIG. 3, multiple layers 130, 130' of a multilayer ceramic package 144 may include vias that align with each other when the layers 130, 130' are stacked on each other thereby allowing the formation of an electrical connection 140 through the multiple layers 130, 130' of the package 144. To form such a connection 140, separate ceramic layers 130, 130' each having an electrically insulated conductor precursor formed therein may be stacked prior to co-firing. Alternatively, multiple layers 130, 130' may be brought together and the insulated conductor formed at the same time in both layers 130, 130'.

The skilled artisan will appreciate that the isolated via and connection formed according to the present invention is suitable for applications requiring isolated electrical connections within multilayer ceramic packages. It is particularly suitable for sensor systems, such as, hydrocarbon (HC) exhaust gas sensors such as a heated exhaust gas oxygen (HEGO) or a universal exhaust gas oxygen (UEGO) sensors. It is also useful as a component in a fuel cell or fuel cell reformer. It may also be employed in multilayer ceramic integrated circuit (MCIC) devices with internal or external buried ground planes.

EXAMPLE

Figure 4:
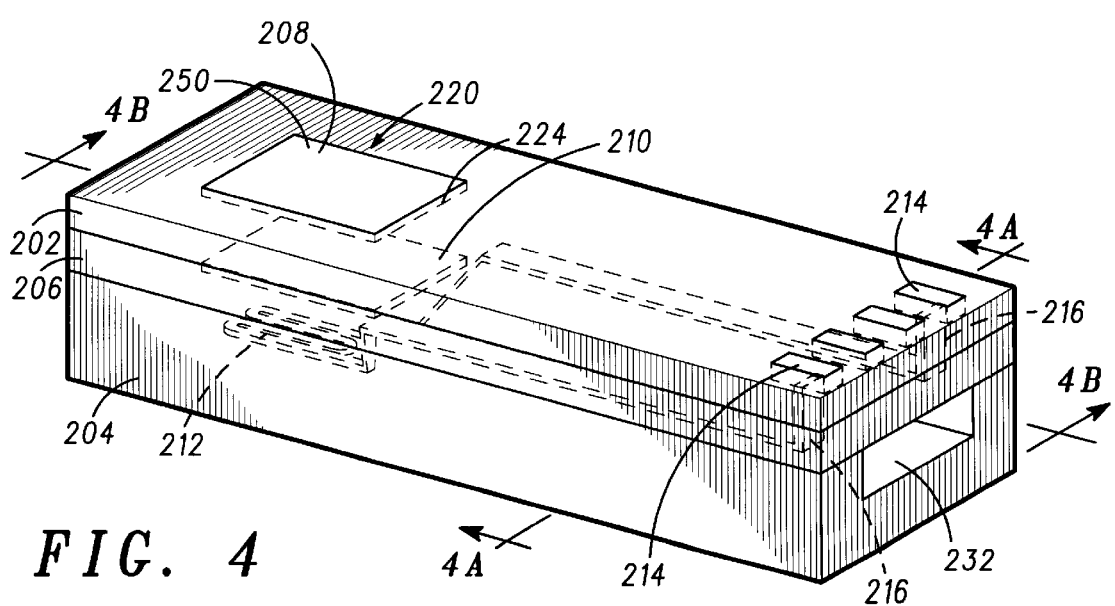
FIG. 4 illustrates a perspective view of a sensor incorporating a ceramic layer in accordance with the present invention.
Figure 4A:
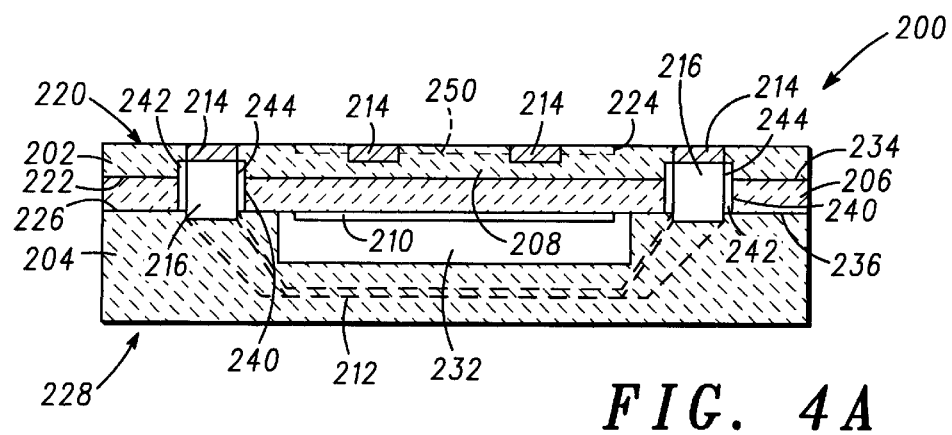
FIG. 4(a) illustrates a cross-sectional view of the sensor of FIG. 4 taken along line 4A—4A.
Figure 4B:
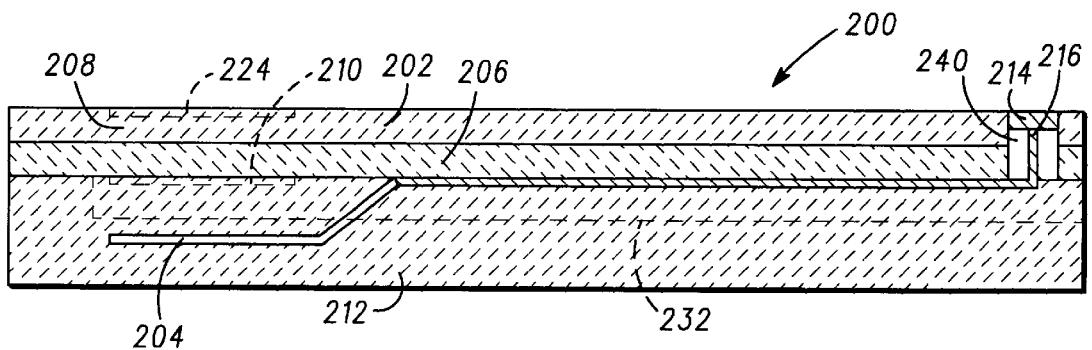
FIG. 4(b) illustrates a cross-sectional view of the sensor of FIG. 4 taken along line 4B—4B.
Figure 4C:
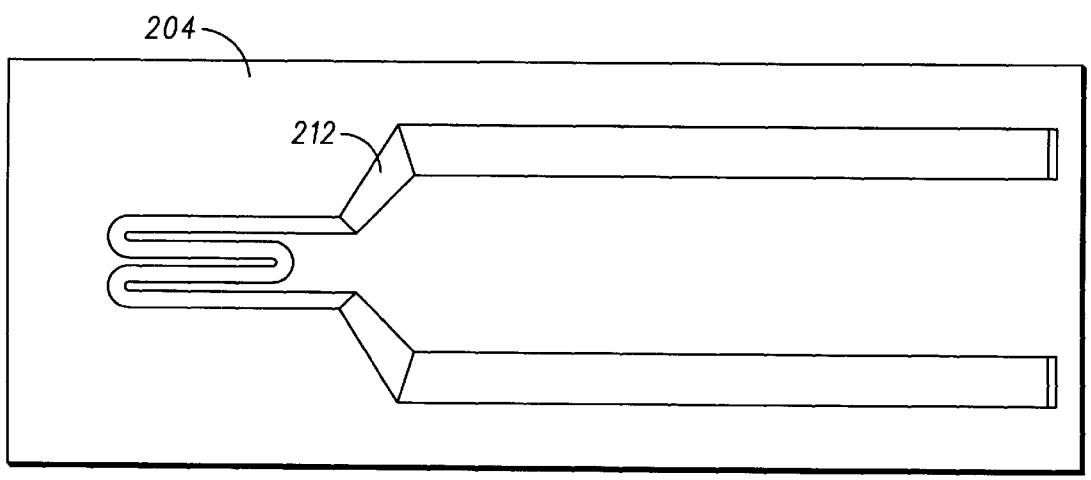
FIG. 4(c) illustrates a top view of a layer of the sensor of FIG. 4.

Referring to FIGS. 4–4(c), one or more isolated electrical connections formed according to the present invention may be used to form a gas sensor, such as an oxygen sensor 200. The oxygen sensor 200 has a first ceramic layer 202, a second ceramic layer 204, a third ceramic layer 206, a first electrode 208, a second electrode 210, a heater 212, input/output (I/O) pads 214 and a pair of electrical connections 216 for connecting a pair of the I/O pads 214 to the heater 212.

In the embodiment disclosed, the first ceramic layer 202 is formed (e.g., starting with an alumina tape) and includes a first surface 220, a second surface 222, the I/O pads 214 and an aperture 224 for receiving the first electrode 208 (the latter being formed by any suitable material removal step). The second ceramic layer 204 is of a like material (e.g., alumina tape) as the first layer 202 and also includes a first surface 226 and a second surface 228. Furthermore, the second ceramic layer 204 includes a cavity 232 and the heater 212 (which may be a resistive heater) within the layer 204.

The third ceramic layer 206 differs from the first and second layers 202, 204. The third ceramic layer 206 is formed of a yttria stabilized zirconia and also includes a first surface 234 and a second surface 236. The third ceramic layer 206 is disposed between the first and second layers 202, 204. Insulated electrical connections 216 are formed through the third layer 206 to electrically connect a pair of the I/O pads 214 in the first layer 202 to the heater 212 in the second layer 204. In one exemplary embodiment, in accordance with the principles outlined previously, the connections 216 are formed by, first, punching a pair of first vias 240 in the zirconia layer 206. Thereafter, the first vias 240 are filled with cross-linkable insulating paste and the paste is cured to form insulator precursors. Then, the insulator precursors are punched to form second vias 244 and the second vias 244 are filled with conductive paste such that the zirconia layer 206, the insulator precursors and the conductive paste can be cofired to form the electrical connections 216 which are isolated from the zirconia layer 206 by insulators 242.

Before or after the electrical connections 216 are formed, the first and second electrodes 208, 210 are printed onto the first and second surfaces 234, 236 of the third layer 106 in an opposing manner.

Then, the first and second ceramic layers 202, 204 are respectively conventionally laminated to the first and second surfaces 234, 236 of the third ceramic layer 206 such that the first electrode 208 resides in the aperture 224 of the first ceramic layer 202 and the second electrode 210 resides in the cavity 232 of the second ceramic layer 204. During this step, the first and second electrodes 208, 210 are conventionally electrically attached to a first and second of the I/O pads 214, and the electrical connections 216 electrically connect a third and fourth of the I/O pads 214 to the heater 212. Furthermore, a porous layer 250 may be applied to the first electrode 208 for protecting the electrode 208 from degradation caused by impurities in gasses such as exhaust gasses to which the electrode 208 may be exposed.

Thereafter, the entire structure is cofired at approximately 1500–1600° C.

The structure described above can also be fabricated entirely using the yttria stabilized zirconia tapes only. A suitable thickfilm alumina insulating paste can be used to provide electrical isolation between the zirconia layers and the embedded electrical heaters and its interconnections. Isolated vias fabricated in the zirconia layers according to this invention provides the electrical connections to the I/O pads on the first zirconia top surface and the embedded heaters in the middle layers. On the top surface, thickfilm alumina insulating layer printed on the first zirconia layer provides the electrical isolation between the I/O pads and the zirconia layer. Thereafter the entire structure is cofired at approximately 1550–1660° C. to form a monolithic ceramic structure.

In operation, the oxygen sensor is positioned such that the coated electrode 208 is exposed to a first or testable mixture of gasses having an unknown percentage of $O_2$ gas such as exhaust gas from an automotive vehicle. The second electrode 210 is exposed to a second or reference mixture of gasses having a known percentage of $O_2$ gas such as air of the earth's atmosphere.

Once properly positioned, a current is induced across the heater 212 through the I/O pads 214 and, therefore, through the electrical connections 216. Consequently, the heater 212 elevates the temperature of the zirconia layer 206 and the zirconia layer 206 becomes oxygen ion conductive. If the $O_2$ partial pressure of the first or testable gas is different from the $O_2$ partial pressure of the second or reference gas, an electromotive force (EMF) or voltage is induced across the first and second electrodes 208, 210 which can be conventionally measured. Accordingly the partial pressure of $O_2$ within the first or unknown mixture of gasses can be conventionally computed using an equation such as:

$$E=(RT/4F)(ln(P_{O2first}/P_{O2second}))$$

and solving for $P_{O2first}$ wherein $P_{O2second}$ is the partial pressure of oxygen in the second or reference mixture of gasses, R is the gas constant, T is absolute temperature in Kelvin, E is the electromotive force, F is Faraday's constant and $P_{O2first}$ is the partial pressure of oxygen in the first or testable mixture of gasses.

Advantageously, the electrical connections 216 are electrically isolated from the zirconia layer 206 such that minimal interference is experienced between the electrodes 208, 210.

Advantageously, the method of forming an electrically isolated via according to the present invention provides a efficient and effective manner in which to form electrically isolated electrical connections in multilayer ceramic packages.

Although various embodiments of this invention have been shown and described, it shall be understood that variations, modifications and substitutions, as well as rearrangements and combinations of the preceding embodiments can be made by those skilled in the art without departing from the novel spirit and scope of this invention.

What is claimed is:

1. A method for forming an electrically isolated conductive path in a multilayer ceramic package, said ceramic package having at least a first ceramic layer, said first ceramic layer capable of functional operation above a temperature of about 500° C., said method comprising:

forming a first via in said first ceramic layer;

filling said first via with hardenable paste;

hardening said hardenable paste to form an insulator precursor forming a second via in said insulator precursor;

filling said second via with a conductive paste, said conductive paste being isolated from said first layer; and sintering said multilayer ceramic package to form a substantially monolithic structure.

2. The method as in claim 1, wherein said hardenable paste includes a cross-linkable binder and said step of hardening said paste includes cross-linking said binder.

3. The method as in claim 2, wherein said cross-linking is accomplished by exposing said paste to ultra-violet rays.

4. The method as in claim 2, wherein said cross-linking is accomplished by thermal initiation.

5. The method as in claim 1 further comprising, filling said second via with a conductive paste for forming an electrical connection and placing said first layer between a second and third ceramic layer for forming said multilayer ceramic package as a sensor.

6. The method as in claim 5, wherein said electrical connection electrically connects a heater to an input/output pad within said sensor.

* * * * *